United States Patent
Tokuda et al.

(10) Patent No.: US 7,679,089 B2
(45) Date of Patent: Mar. 16, 2010

(54) ORGANIC LIGHT EMITTING DISPLAY

(75) Inventors: Naoki Tokuda, Mobara (JP); Toshihiro Sato, Mobara (JP)

(73) Assignee: Hitachi Displays, Ltd. (JP)

( * ) Notice: Subject to any disclaimer, the term of this patent is extended or adjusted under 35 U.S.C. 154(b) by 555 days.

(21) Appl. No.: 11/488,637

(22) Filed: Jul. 19, 2006

(65) Prior Publication Data

US 2007/0045616 A1    Mar. 1, 2007

(30) Foreign Application Priority Data

Jul. 20, 2005    (JP)    ............... 2005-209503

(51) Int. Cl.
- H01L 27/15    (2006.01)
- H01L 29/26    (2006.01)
- H01L 31/12    (2006.01)
- H01L 33/00    (2006.01)

(52) U.S. Cl. ............... 257/79; 257/13; 257/103; 257/40; 257/E21.092; 257/E51.022; 313/504; 313/506; 313/512; 438/149; 438/153; 438/257

(58) Field of Classification Search ............... 257/13, 257/40, 79–103, 919, 323, E21.092, E21.166, 257/E21.134, E21.332, E33.001, E33.064, 257/E25.008, E51.022, E51.019; 313/504, 313/506, 512; 438/23, 40, 79–103, 919, 438/323, E21.092, E21.166, E21.134, E21.332, 438/E33.001, E33.064, E25.008, E51.022, 438/E51.019, 149, 153, 257

See application file for complete search history.

(56) References Cited

U.S. PATENT DOCUMENTS

| | | | |
|---|---|---|---|
| 7,446,336 B2 * | 11/2008 | Yamazaki et al. | 257/59 |
| 2003/0062519 A1 * | 4/2003 | Yamazaki et al. | 257/40 |
| 2004/0004436 A1 * | 1/2004 | Yoneda | 313/512 |
| 2004/0245541 A1 * | 12/2004 | Shitagaki et al. | 257/103 |
| 2005/0168138 A1 * | 8/2005 | Okunaka et al. | 313/504 |
| 2006/0214575 A1 * | 9/2006 | Kajiyama et al. | 313/506 |

FOREIGN PATENT DOCUMENTS

| | | |
|---|---|---|
| JP | 2001-237063 | 8/2001 |
| JP | 2002-093574 | 3/2002 |
| JP | 2003-022891 | 1/2003 |
| JP | 2004-047458 | 2/2004 |

* cited by examiner

*Primary Examiner*—Zandra Smith
*Assistant Examiner*—Telly D Green
(74) *Attorney, Agent, or Firm*—Antonelli, Terry, Stout, Kraus, LLP.

(57) ABSTRACT

An organic light emitting display provided according to the invention maintains light emission efficiency and elongates its lifetime by radiating heat generated from organic light emitting elements to the outside of an encapsulated area. In the organic light emitting display, a part of a cathode is extended to the outside of the encapsulated area of a main substrate to form a radiation section integrally with the cathode. Heat generated from organic light emitting elements is diffused and radiated from the radiation section so that the heat can be discharged therefrom.

17 Claims, 4 Drawing Sheets

ORGANIC LIGHT EMITTING DISPLAY

CROSS-REFERENCE TO RELATED APPLICATIONS

The disclosure of Japanese Patent Application No. 209503/2005 filed on Jul. 20, 2005 including the specification, drawings and abstract is incorporated herein by reference in its entirety.

BACKGROUND

1. Field of the Invention

The present invention relates to an organic light emitting display which includes an organic light emitting layer between a pair of electrodes and emits light from the organic light emitting layer by applying electric fields to the light emitting layer using the pair of the electrodes, and more particularly to an organic light emitting display which acquires long lifetime and high reliability by preventing deterioration of light emitting area efficiency of organic light emitting elements caused by heat generated from the organic light emitting layer which constitutes the light emitting area.

2. Description of Related Arts

Currently, a flat-panel-type display such as a liquid crystal display (LCD), a plasma display (PDP), a field-emission-type display (FED), an organic light emitting display (OLED) has been put to practical use or under development for practical use. Among these displays, the organic light emitting display is a highly expected display as a typical thin and light-weight self-light-emission-type display. The organic light emitting display can be divided into so-called bottom emission type and top emission type.

According to the bottom-emission-type organic light emitting display, organic light emitting elements have a light emitting mechanism produced by sequentially laminating, on an insulating substrate which is preferably a glass substrate, a transparent conductive thin layer formed by ITO (In—Tin (Sn)—O) or IZO (In—Zn—O) or the like as a first electrode or one electrode, an organic light emitting layer (also referred to as organic multilayer) which emits light when electric fields are applied, and a reflective metal electrode as a second electrode or the other electrode. A number of the organic light emitting elements thus produced are arranged in matrix, and the resultant laminating structure is covered by another substrate also referred to as encapsulating can so that the light emitting structure can be isolated from the outside atmosphere.

When electric fields are applied between the transparent electrode set as anode and the metal electrode set as cathode, for example, carriers (electrons and holes) are injected into the organic light emitting layer and thus light is emitted from the organic light emitting layer. The emitted light is released through the glass substrate to the outside.

In the top-emission-type organic light emitting display, electric fields are applied between a reflective metal electrode as one electrode and a transparent electrode formed by ITO or the like as the other electrode to cause emission of light from the organic light emitting layer. The emitted light is released from the other electrode. The top-emission-type display uses a transparent plate, preferably a glass plate, as the encapsulating can similar to that of the bottom-emission-type display.

FIGS. 5A and 5B schematically illustrate a known structure example of an organic light emitting display. FIG. 5A is a plan view showing the entire structure of a main part, in which peripheral semiconductor elements, organic electroluminescence sections and the like disposed on the lower surface of a cathode layer are shown on the upper surface thereof for the sake of simplification. FIG. 5B is an enlarged cross-sectional view showing a pixel and its vicinity taken along a line A-B in FIG. 5A.

The organic light emitting display shown in FIG. 5 is of active matrix type, and includes a thin-film transistor TFT on the main surface (inner surface) of a light-transmissive main substrate SUB1 which is preferably glass. Organic light emitting elements EL are produced by inserting an organic light emitting layer OLE between first electrodes ADs (anodes in this example) driven by the thin-film transistor TFT and a second electrode (cathode in this example) CD. The thin-film transistor TFT is constituted by a polysilicone semiconductor layer PSI, a gate insulating layer IS1, a gate line (gate electrode) GL, a source drain electrode SD, and an intermediate insulating layer IS2.

Each of the anodes ADs as pixel electrodes is constituted by a transparent conductive layer (ITO) formed on the upper surface of a passivation layer PSV, and is electrically connected with the source drain electrode SD at a contact hole CH1 provided on the passivation layer PSV. The organic light emitting layer OLE is formed on a concave surrounded by a bank BNK produced by an insulating layer applied onto the anode AD by deposition, ink-jet method or other application methods.

The cathode CD formed by a conductive overall layer such as aluminum thin layer and chrome thin layer covers the organic light emitting layer OLE and the bank BNK. One end of the cathode CD is electrically connected with a cathode line CDL provided on the intermediate layer IS2 at a contact hole CH2 formed on the passivation layer PSV out of the pixel area.

A display area AR is produced by arranging a number of pixels shown in FIG. 5B in matrix in a major part of the center of the main substrate SUB1. Scanning drive circuits (gate drivers) GDR1 and GDR2 are provided on the left and right sides of the display area AR, and not-shown respective gate lines extending from the gate driver GDR1 and the gate driver GDR2 are alternately disposed. A data drive circuit (drain driver) DDR is equipped below the display area AR, and not-shown drain lines as data lines cross the respective gate lines.

A current supply bus CSLB is provided above the display area AR, and current supply lines CSL extend from the current supply bus CSLB. In this structure, one pixel is provided within an area surrounded by the respective gate lines, the drain lines, and the current supply lines CSL. The cathode CD covers the display area AR, the respective gate drivers GDR1 and GDR2, and the drain driver DDR inside a seal member SL. A contact area CTH connects the cathode CD with the cathode line CDL provided on the lower surface of the main substrate SUB1.

Also provided are signal supply lines GL1 and GL2 of the gate driver GDR1, signal supply lines GL3 and GL4 of the gate driver GR2, a signal supply line DL1 of the drain driver DDR, an electrode line SDL of the source drain electrode SD, and an input terminal TM connecting the respective signal supply lines GL1, GL2, GL3, GL4, DL1, the cathode line CDL, the anode line, and other lines to the external circuits.

The organic light emitting display in this example is a so-called bottom-emission-type display. Light L emitted from pixel openings of the organic light emitting layer OLE is released through the surface of the main substrate SUB1 to the outside in the direction shown by an arrow. Thus, the cathode CD has light reflection capability. An encapsulating glass substrate SUB2 also referred to as encapsulation can is affixed to the main surface of the main substrate SUB1 via the seal member SL so as to encapsulate the inside of the seal extending around the not-shown circumferential area into a vacuum condition.

According to the organic light emitting display having this structure, when carriers are injected into the organic light emitting layer OLE of the light emission mechanism in accordance with electric fields applied between the anode AD and the cathode CD, the organic light emitting elements EL emit light. In this case, not all carriers thus injected are used for light emission, but a part of those generates heat and applies heat to the light emission mechanism. Generated heat generally deteriorates the light emission characteristic of the material of the organic light emitting layer OLE constituting the light emission mechanism, and shortens its lifetime. It is therefore necessary to eliminate this heat generation.

To cope with the problem of heat generation, a structure disclosed in Japanese Patent Laid-Open No. 22891/2003 enhances radiation of heat by enlarging the surface area of a cathode. A structure shown in Japanese Patent Laid-Open No. 47458/2004 improves radiation of heat by interposing a thermal conductive spacer between a cathode and an encapsulating substrate and forming metal coating layer on the surface of the encapsulating substrate. A structure described in Japanese Patent Laid-Open No. 93574/2002 attains greater radiation of heat by injecting highly thermal-conductive liquid between a cathode and an encapsulating substrate. A structure explained in Japanese Patent Laid-Open No. 237063/2001 offers greater radiation of heat by providing a radiation layer having holes corresponding to the shapes of respective pixels on the viewing surface of a substrate.

SUMMARY

However, in the organic light emitting displays having these structures in which a radiation section is simply disposed or affixed to the back of a substrate, when the substrate is constituted by a material having low thermal conductivity such as glass, the heat conduction distance between the radiation section and the organic light emitting elements, especially the organic light emitting layer, is large. Therefore, sufficient radiation of heat cannot be achieved, and thus deterioration of the light emission characteristic of the organic light emitting layer constituting the light emitting mechanism is accelerated by heat generated at the time of turning on. Moreover, the generated heat shortens the lifetime of the organic light emitting display.

Accordingly, it is an object of the invention to provide an organic light emitting display capable of maintaining light emission efficiency and elongating its lifetime by preventing temperature increase of organic light emitting elements caused by emission of light.

In order to achieve this object, an organic light emitting display according to an aspect of the invention has a part of a second electrode (cathode) which part is extended to the outside of an encapsulated area. The extended part of the second electrode (cathode) can function as a radiation section or a component contacting other metal functioning as a radiation section outside the encapsulated area. This structure shortens the heat conduction distance between organic light emitting elements and the radiation section, and thus promotes thermal diffusion. Accordingly, the problems arising from the background art can be solved.

In an organic light emitting display according to another aspect of the invention, it is preferable that an electrode line of the above structure is formed by the same metal layer as that of the second electrode. In this case, since heat generated from the organic light emitting elements is efficiently conducted to the radiation section via the electrode line, thermal diffusion from the radiation section can be promoted. Accordingly, the problems arising from the background art can be solved.

In an organic light emitting display according to another aspect of the invention, it is preferable that the radiation section of the above structure is formed by the same metal layer as that of the second electrode. In this case, since heat generated from the organic light emitting elements is efficiently conducted to the second electrode and to the radiation section, thermal diffusion from the radiation section can be promoted. Accordingly, the problems arising from the background art can be solved.

In an organic light emitting display according to another aspect of the invention, it is preferable that the metal layer of the above structure is formed by an aluminum layer or a metal layer including aluminum. In this case, since heat generated from the organic light emitting elements is efficiently conducted to the second electrode and to the radiation section, thermal diffusion from the radiation section can be promoted. Accordingly, the problems arising from the background art can be solved.

In an organic light emitting display according to another aspect of the invention, a part of an electrode line connected with a second electrode (cathode) is extended to the outside of an encapsulated area. The extended part of the electrode line can function as a radiation section or a component contacting other metal functioning as a radiation section outside an encapsulated area. This structure shortens the heat conduction distance between organic light emitting elements and the radiation section, and thus promotes thermal diffusion from the radiation section. Accordingly, the problems arising from the background art can be solved.

In an organic light emitting display according to another aspect of the invention, a part of an electrode line connected with a second electrode (cathode) is extended to the outside of an encapsulated area. Additionally, a thermal conductor contacting the part of the electrode line extended to the outside of the encapsulated area is provided on the outer surface of an insulating substrate. This structure shortens the heat conduction distance between organic light emitting elements and the thermal conductor, and thus promotes thermal diffusion from the thermal conductor. Accordingly, the problems arising from the background art can be solved.

In an organic light emitting display according to another aspect of the invention, it is preferable that the thermal conductor of the above structure is formed by an aluminum layer or a metal layer including aluminum. In this case, heat conducted to the radiation section is efficiently diffused, and thus the problems arising from the background art can be solved.

In an organic light emitting display according to another aspect of the invention, it is preferable that the thermal conductor of the above structure is formed by a resin layer having high heat conductivity. In this case, heat conducted to the radiation section is efficiently diffused, and thus the problems arising from the background art can be solved.

In an organic light emitting display according to another aspect of the invention, it is preferable that the thermal conductor of the above structure has fine concaves and convexes on its outer surface. In this case, heat conducted to the radiation section is efficiently diffused, and thus the problems arising from the background art can be solved.

The invention is not limited to the structures which have been mentioned above and examples which will be described later. As obvious, various modifications and changes may be given to the invention without departing from the scope and spirit thereof.

In the organic light emitting display according to an aspect of the invention, the heat conduction distance between the organic light emitting elements and the radiation section is shortened. As a result, thermal diffusion from the radiation section is promoted, and thus heat radiation efficiency is increased. Since the light emission efficiency of the organic light emitting elements is not deteriorated, extremely preferable advantages such as elongation of lifetime and reduction of power consumption of the organic light emitting display can be offered.

In the organic light emitting display according to another aspect of the invention, the heat conduction distance between the organic light emitting elements and the thermal conductor via the radiation section is shortened. As a result, thermal diffusion from the thermal conductor is further promoted, and thus heat radiation efficiency is further improved. Since the light emission efficiency of the organic light emitting elements is not deteriorated, extremely preferable advantages such as elongation of lifetime and reduction of power consumption of the organic light emitting display can be offered.

In the organic light emitting display according to another aspect of the invention, radiation means capable of achieving considerable heat radiation can be easily produced at a low cost without greatly changing the processes for manufacturing active elements, the organic light emitting elements and other components. Thus, extremely preferable advantages such as cost reduction of the organic light emitting display having high quality and high reliability can be offered.

BRIEF DESCRIPTION OF THE DRAWINGS

FIGS. 1A and 1B schematically illustrate a structure of an active-matrix-type organic light emitting display in a first embodiment according to the invention, wherein: FIG. 1A is a plan view showing an entire structure of a main part; and FIG. 1B is an enlarge cross-sectional view of a pixel and its vicinity taken along a line A-B in FIG. 1A.

FIGS. 2A and 2B schematically illustrate a structure of an active-matrix-type organic light emitting display in a second embodiment according to the invention, wherein: FIG. 2A is a plan view showing an entire structure of a main part; and FIG. 2B is an enlarge cross-sectional view of a pixel and its vicinity taken along a line A-B in FIG. 2A.

FIGS. 5A and 5B schematically illustrate a structure of an active-matrix-type organic light emitting display in a related art, wherein: FIG. 5A is a plan view showing an entire structure of a main part; and FIG. 5B is an enlarged cross-sectional view of a pixel and its vicinity taken along a line A-B in FIG. 5A.

DETAILED DESCRIPTION OF THE INVENTION

Specific embodiments according to the invention are hereinafter described in detail with reference to the appended drawings. In these embodiments, a so-called bottom-emission-type organic light emitting display is discussed as an example.

First Embodiment

Figure 1A:
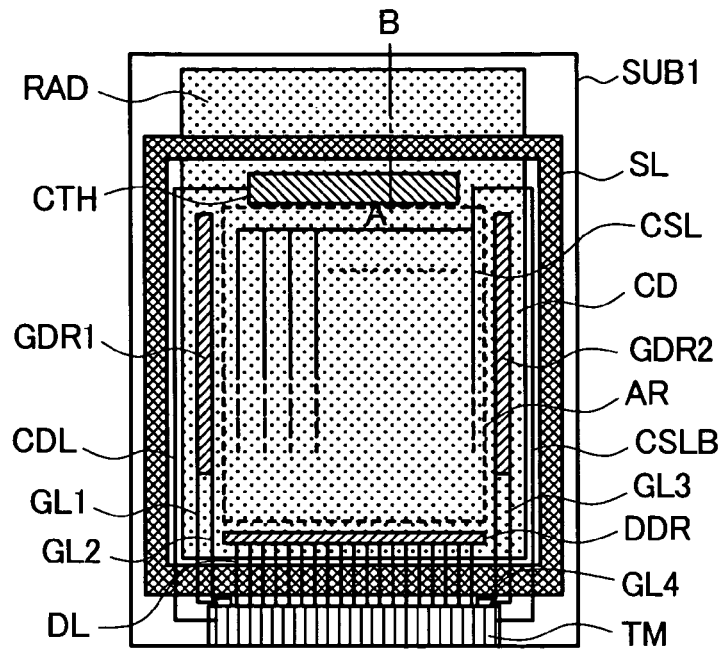
Figure 1B:
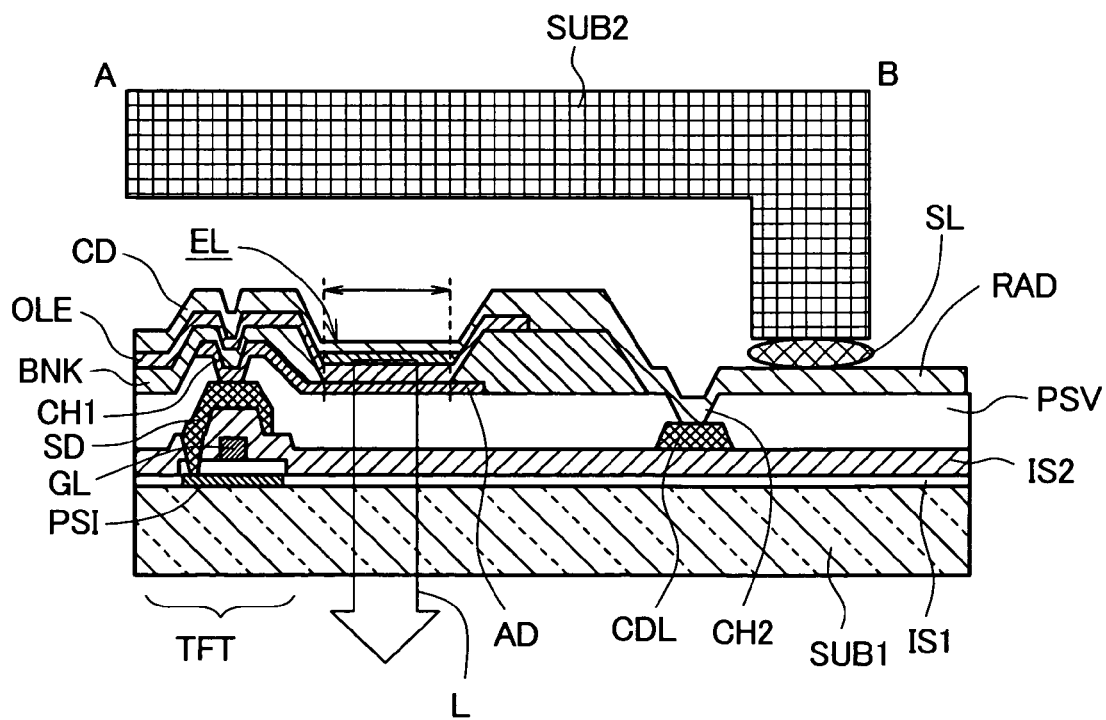
Figure 5A:
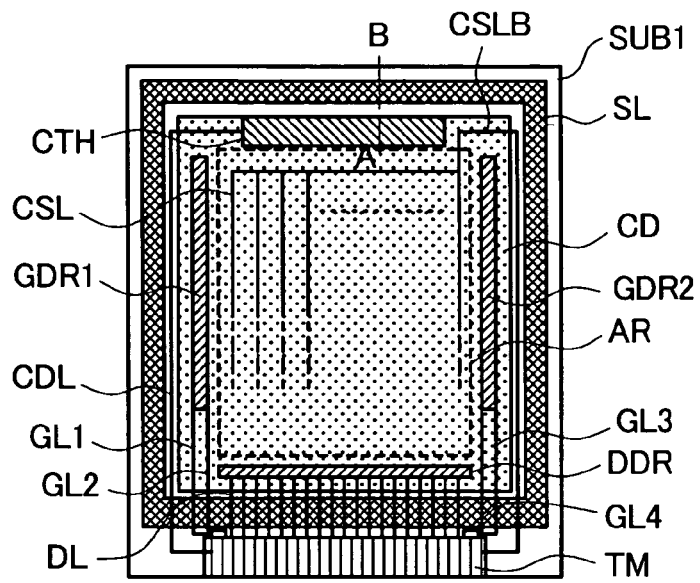
Figure 5B:
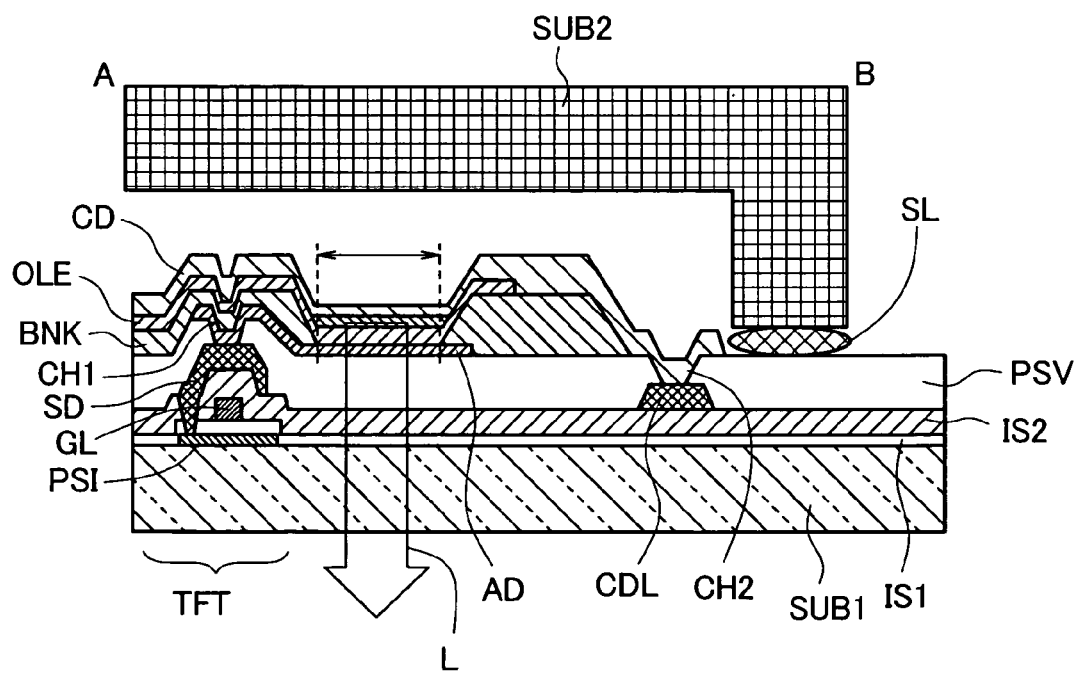

FIGS. 1A and 1B schematically illustrate a structure of an active-matrix-type organic light emitting display in a first embodiment according to the invention. FIG. 1A is a plan view showing an entire structure of a main part. FIG. 1B is an enlarged cross-sectional view showing a pixel and its vicinity taken along a line A-B in FIG. 1A. Reference numerals similar to those in FIGS. 5A and 5B are given to similar parts and components, and explanation of those is not repeated herein.

The organic light emitting display shown in FIGS. 1A and 1B includes a number of the organic light emitting elements EL extending throughout the surface of a display area AR. The end of the cathode CD as a second electrode, which is formed by aluminum material or metal material including aluminum, for example, and constitutes the organic light emitting elements EL, reaches outside the encapsulated area defined by the seal member SL at the end of the main substrate SUB1. This end forms a radiation section RAD which is formed by the same aluminum material as that of the cathode CD and disposed on the passivation layer PSV such that the radiation section RAD lies on the same plane as that of the cathode CD and is formed integrally therewith. The layer thickness of the radiation section RAD is several hundreds μm. The seal member SL is made of ultraviolet-hardening resin, but other seal materials may be used.

The radiation section RAD having this structure can be produced only by modifying a part of a cathode forming mask used when the cathode CD is formed by depositing or sputtering aluminum or chrome or by other methods. Thus, the radiation section RAD is made of the same material, manufactured by the same processes, and formed integrally with the cathode at the same time. Accordingly, the radiation section RAD can be easily produced without necessity of additional forming process for the radiation section RAD.

In the organic light emitting display having this structure, heat generated from the internal respective electrodes, electrode lines, gate driver GDR, drain driver DDR, organic light emitting elements EL and other components are conducted through the cathode CD to the radiation section RAD. The conducted heat is efficiently diffused and radiated to the outside from the radiation section RAD which has large surface area and is exposed out of the encapsulated area. As shown in FIG. 1A, the radiation section RAD has width wider than the collective width of the organic light emitting elements EL in the display region AR when considered left to right width direction. Thus, the heat remaining around the organic light emitting elements EL can be efficiently discharged.

Second Embodiment

Figure 2A:
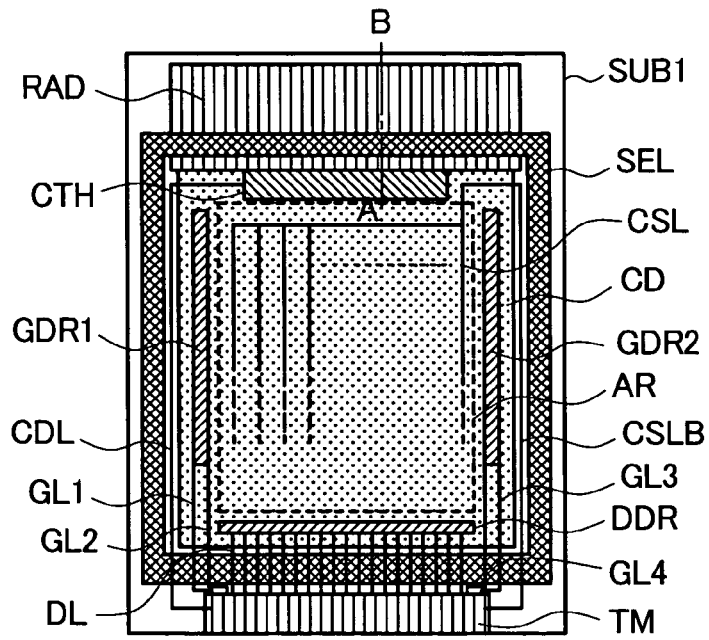
Figure 2B:
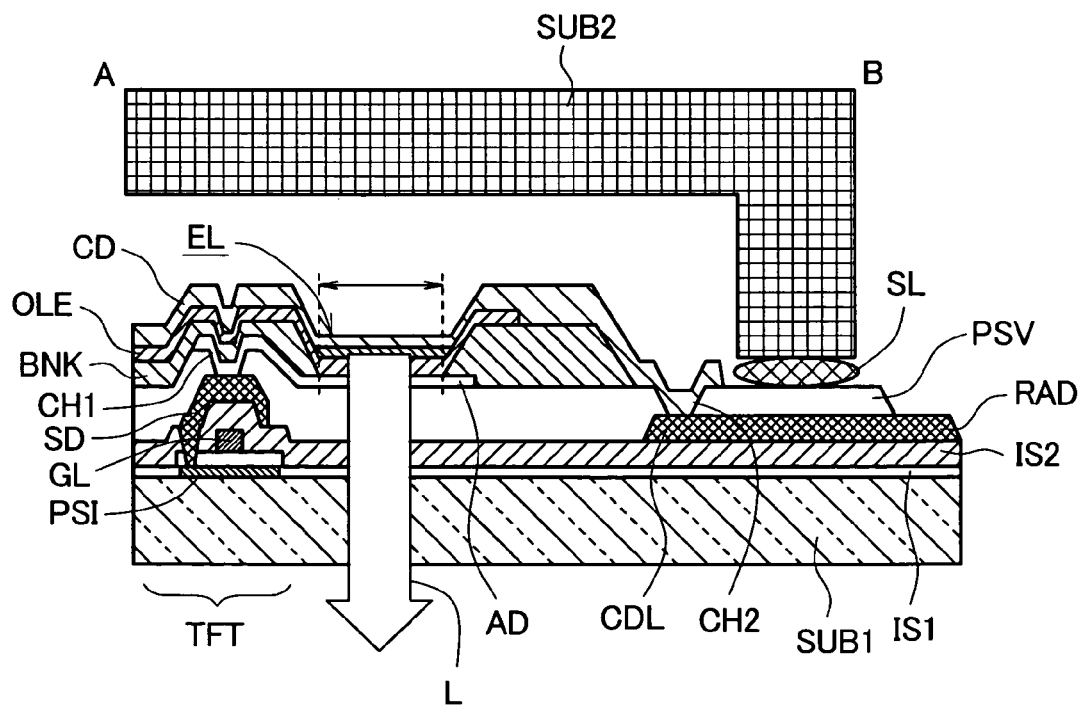

FIGS. 2A and 2B schematically illustrate a structure of an active-matrix-type organic light emitting display in a second embodiment according to the invention. FIG. 2A is a plan view showing an entire structure of a main part. FIG. 2B is an enlarged cross-sectional view showing a pixel and its vicinity taken along a line A-B in FIG. 2A. Reference numerals similar to those in FIGS. 5A and 5B are given to similar parts and components, and explanation of those is not repeated herein.

In the organic light emitting display shown in FIGS. 2A and 2B, apart of the cathode line CDL which is formed by aluminum material and disposed between the intermediate insulating layer IS2 of the main substrate SUB1 and the passivation layer PSV extends to the outside of the encapsulated area of the main substrate SUB1 on the intermediate insulating layer IS2. This part corresponds to the radiation section RAD formed integrally with the cathode line CDL. The radiation section RAD is made of the same aluminum material and manufactured by the same processes as those of the cathode line CDL, and formed integrally with the cathode line CDL at the same time.

In this structure, the capsulation glass substrate SUB2 is attached via the seal member SL to the passivation layer PSV formed on the radiation section RAD on the main substrate SUB1.

In the organic light emitting display having this structure, heat generated from the internal respective electrodes, electrode lines, gate driver GDR, drain driver DDR, organic light emitting elements EL and other components are conducted through the cathode CD and the cathode line CDL to the radiation section RAD. The conducted heat is efficiently diffused and radiated to the outside from the radiation section RAD which has large surface area and is exposed out of the encapsulated area. Thus, the heat remaining around the organic light emitting elements EL can be efficiently discharged.

Additionally, in the organic light emitting display having this structure, the radiation section RAD is extended out of the encapsulated area while covered by the passivation layer PSV. This moisture-proofed structure is therefore highly appropriate for the encapsulated area which can be damaged by moisture entering from the surrounding environment or the like. Moreover, since the radiation section RAD is located via the passivation layer PSV below the seal member SL for attaching the encapsulation glass substrate SUB2, there is no possibility of deteriorating the sealing adhesiveness of the seal member SL such as separation of the seal member SL.

Third Embodiment

Figure 3:
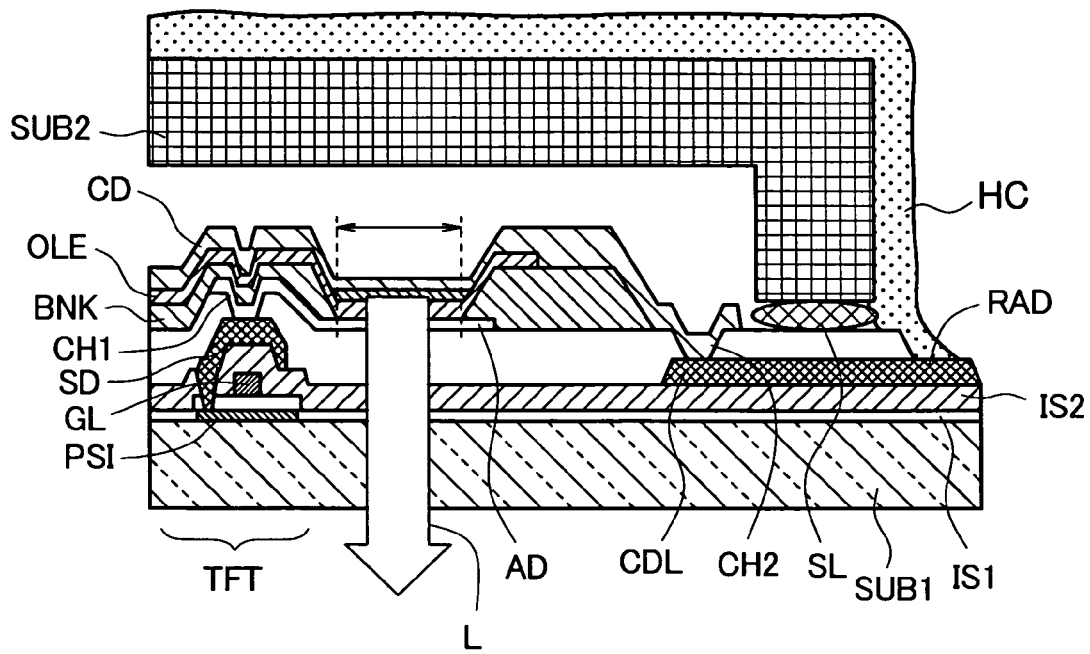
FIG. 3 is an enlarged cross-sectional view schematically illustrating a pixel and its vicinity of an active-matrix-type organic light emitting display in a third embodiment according to the invention.

FIG. 3 schematically illustrates a structure of an active-matrix-type organic light emitting display in a third embodiment according to the invention. FIG. 3 is an enlarged cross-sectional view showing a pixel and its vicinity of a main part of the organic light emitting display. Reference numerals similar to those in FIGS. 2A and 2B are given to similar parts and components, and explanation of those is not repeated herein. The organic light emitting display shown in FIG. 3 has a thermal conductor HC covering the area from the surface of the radiation section RAD which is extended out of the encapsulated area of the main substrate SUB1 to the outer surface of the encapsulation glass substrate SUB2.

The thermal conductor HC is preferably a metal layer such as aluminum layer, copper layer, magnesium layer, and alloys of these materials. These metal layers can be formed by deposition, sputtering, CVD or other methods. Appropriate materials other than the metal layers involve highly heat-conductive silicone resin layer, polymer resin layer, for example. These resin layers can be easily formed by coating or other methods.

In the organic light emitting display having this structure, heat generated from the internal respective electrodes, electrode lines, gate driver GDR, drain driver DDR, organic light emitting elements EL and other components are conducted through the cathode CD and the cathode line CDL to the radiation section RAD. The conducted heat is efficiently diffused and radiated to the outside of the thermal conductor HC which has large surface area and is disposed on the outer surface of the encapsulation glass substrate SUB2. Thus, the heat remaining around the organic light emitting elements EL can be efficiently discharged.

Moreover, since the organic light emitting display having this structure includes the thermal conductor HC whose outer surface has fine concaves and convexes, the surface area of the thermal conductor HC is increased and thus thermal diffusion is enhanced. Accordingly, radiation of heat can be further improved. The fine concave and convex portions can be easily produced by sandblasting, etching or other methods.

In the organic light emission display which has this structure and uses a metal layer as the thermal conductor HC, when the potential of the cathode CD is directly connected with a metal external case of a cellular phone or the like into which the organic light emitting display is incorporated via the cathode line CDL, the radiation section RAD and the thermal conductor HC under the condition where the radiation section RAD contacts the thermal conductor HC formed on the surface of the encapsulation glass SUB2 to discharge heat, the potential of the cathode CD can be stabilized at the reference potential (ground potential).

While the thermal conductor HC is made of a metal layer such as aluminum layer, copper layer, magnesium layer, and alloys of these materials, other components such as radiation sheet and radiation fin formed by these materials may be used instead of the metal layers. Also, the materials for the thermal conductor HC are not specifically limited to these metal components if they are metal materials which can diffuse heat. In this case, heat transmitted from the radiation section RAD can be effectively conducted to the thermal conductor HC and then be efficiently diffused and radiated therefrom to the outside when the thermal conductor HC is affixed using highly heat conductive adhesive such as silicone adhesive.

Fourth Embodiment

Figure 4:
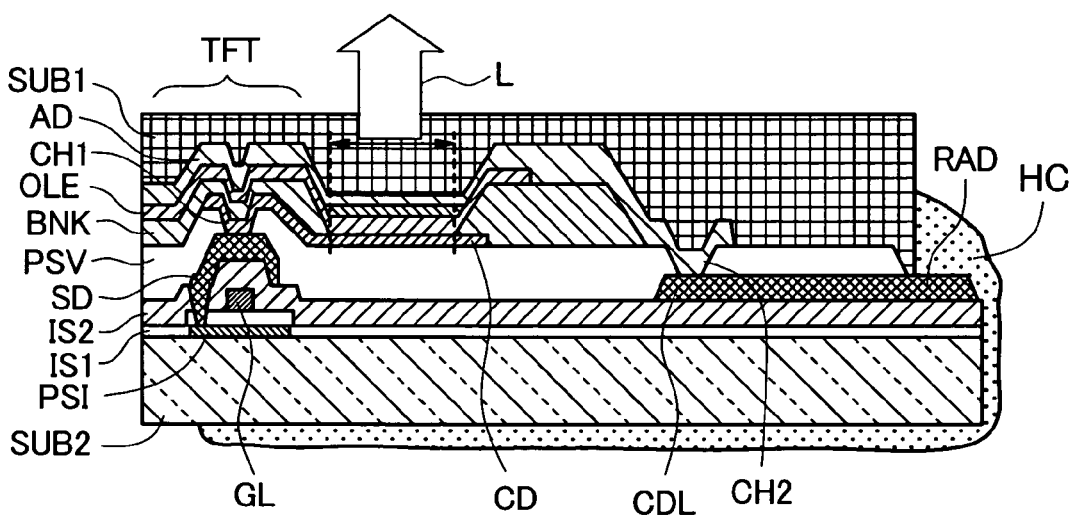
FIG. 4 is an enlarged cross-sectional view schematically illustrating a pixel and its vicinity of an active-matrix-type organic light emitting display in a fourth embodiment according to the invention.

While the bottom-emission-type organic light emitting display has been described in above embodiments, the invention is applicable to other types of organic light emitting display. FIG. 4 is an enlarged cross-sectional view showing a pixel and its vicinity of a main part of a top-emission-type organic light emission display. This organic light emitting display has the thermal conductor HC covering the area from the surface of the radiation section RAD which is extended out of the encapsulated area of the main substrate SUB1 to the outer surface of the encapsulation glass substrate SUB2. Obviously, the structure in this embodiment can offer almost the same operations and advantages as those in the first, second and third embodiments.

While the organic light emitting display including the organic light emitting elements has been described in the above embodiments, it is obvious that the invention is applicable to all devices provided with organic light emitting elements such as TVs, personal computer monitors, portable personal computers, personal digital assistants, cellular phones, digital still cameras, digital video cameras, and car navigation monitors.

What is claimed is:

1. An organic light emitting display, comprising:
an insulating substrate; and
a light-transmissive substrate opposed to the insulating substrate, wherein:
the light-transmissive substrate is air-tightly encapsulated by the insulating substrate via an encapsulating member disposed at the periphery of the light-transmissive substrate;

a plurality of organic light emitting elements are provided on an air-tightly encapsulated main surface of the light-transmissive substrate in a display area thereof;

the organic light emitting elements have a plurality of first electrodes formed on the main surface of the light-transmissive substrate in the display area, an organic light emitting layer collectively covering the plural first electrodes and having light emission capability, and a second electrode disposed on the organic light emitting layer to collectively correspond to the plural organic light emitting elements;

light emitted from the organic light emitting layer goes through the first electrodes to the outside of the light-transmissive substrate; and a part of the second electrode extends outside of the encapsulating member, and a width of the part of the second electrode which extends outside of the encapsulating member is wider than a collective width of the plurality of organic light emitting elements arranged in a width direction in the display area of the light-transmissive substrate.

2. An organic light emitting display according to claim 1, wherein the part of the second electrode extending to the outside of the encapsulating member is configured as a radiation section which radiates heat generated from the plurality of organic light emitting elements to outside of the encapsulating member.

3. An organic light emitting display according to claim 1, wherein:

a metal member configured as a radiation section is disposed outside the encapsulating member; and the part of the second electrode extending to the outside of the encapsulating member contacts the metal member.

4. An organic light emitting display according to claim 3, wherein the metal member is an aluminum layer or a metal layer including aluminum.

5. An organic light emitting display, comprising:

an insulating substrate; and a light-transmissive substrate opposed to the insulating substrate, wherein:

the light-transmissive substrate is air-tightly encapsulated by the insulating substrate via an encapsulating member disposed at the periphery of the light-transmissive substrate;

a plurality of organic light emitting elements are provided on an air-tightly encapsulated main surface of the light-transmissive substrate in a display area thereof;

the organic light emitting elements have a plurality of first electrodes formed on the main surface of the light-transmissive substrate in the display area, an organic light emitting layer collectively covering the plural first electrodes and having light emission capability, and a second electrode disposed on the organic light emitting layer to collectively correspond to the plural organic light emitting elements;

light emitted from the organic light emitting layer goes through the first electrodes to the outside of the light-transmissive substrate;

the second electrode is connected with an electrode line inside of the encapsulating member; and a part of the electrode line extends outside of the encapsulating member and a width of the part of the electrode line which extends outside of the encapsulating member is wider than a collective width of the plurality of organic light emitting elements arranged in a width direction in the display area of the light-transmissive substrate.

6. An organic light emitting display according to claim 5, wherein the part of the electrode line extending to the outside of the encapsulating member is configured as a radiation section which radiates heat generated from the plurality of organic light emitting elements to outside of the encapsulating member.

7. An organic light emitting display according to claim 5, wherein:

a metal member configured as a radiation section is disposed outside the encapsulating member; and the part of the electrode line extending to the outside of the encapsulating member contacts the metal member.

8. An organic light emitting display according to claim 5, wherein the electrode line is formed by the same metal layer as that of the second electrode.

9. An organic light emitting display according to claim 5, wherein the metal member is an aluminum layer or a metal layer including aluminum.

10. An organic light emitting display, comprising:

an insulating substrate; and a light-transmissive substrate opposed to the insulating substrate, wherein:

the light-transmissive substrate is air-tightly encapsulated by the insulating substrate via an encapsulating member disposed at the periphery of the light-transmissive substrate;

a plurality of organic light emitting elements are provided on an air-tightly encapsulated main surface of the light-transmissive substrate in a display area thereof;

the organic light emitting elements have a plurality of first electrodes formed on the main surface of the light-transmissive substrate in the display area, an organic light emitting layer collectively covering the plural first electrodes and having light emission capability, and a second electrode disposed on the organic light emitting layer to collectively correspond to the plural organic light emitting elements;

light emitted from the organic light emitting layer goes through the first electrodes to the outside of the light-transmissive substrate;

the second electrode is connected with an electrode line inside of the encapsulating member;

a part of the electrode line extends outside of the encapsulating member and a width of the part of the electrode line which extends outside of the encapsulating member is wider than a collective width of the plurality of organic light emitting elements arranged in a width direction in the display area of the light-transmissive substrate; and a thermal conductor contacting the part of the electrode line extending to the outside of the encapsulating member is provided at least on a portion of one of an outer surface of the insulating substrate and an outer surface of the encapsulating member.

11. An organic light emitting display according to claim 10, wherein the electrode line is formed by the same metal layer as that of the second electrode.

12. An organic light emitting display according to claim 10, wherein the electrode line is an aluminum layer or a metal layer including aluminum.

13. An organic light emitting display according to claim 10, wherein the thermal conductor is an aluminum layer or a metal layer including aluminum.

14. An organic light emitting display according to claim 10, wherein the thermal conductor is a resin layer.

15. An organic light emitting display according to claim 10, wherein the thermal conductor has fine concaves and convexes on its outer surface.

16. An organic light emitting display according to claim 14, wherein the thermal conductor has fine concaves and convexes on its outer surface.

17. An organic light emitting display according to claim 10, wherein the part of the electrode line extending to the outside of the encapsulating member is configured as a radiation section which radiates heat generated from the plurality of organic light emitting elements to outside of the encapsulating member, and wherein the thermal conductor radiates heat radiated from the part of the electrode line.

* * * * *